United States Patent [19]

Shinada

[11] Patent Number: 4,882,607

[45] Date of Patent: Nov. 21, 1989

[54] OPTICAL SEMICONDUCTOR DEVICE

[75] Inventor: Hidetoshi Shinada, Kanagawa, Japan

[73] Assignee: Fuji Photo Film Co., Ltd., Kanagawa, Japan

[21] Appl. No.: 263,857

[22] Filed: Oct. 28, 1988

[30] Foreign Application Priority Data

Oct. 28, 1987 [JP] Japan .................................. 62-272714

[51] Int. Cl.$^4$ ............................................. H01L 31/12
[52] U.S. Cl. ........................................ 357/19; 357/17
[58] Field of Search .................... 357/19, 17, 30 F, 88

[56] References Cited

U.S. PATENT DOCUMENTS

| | | | |
|---|---|---|---|
| 4,760,579 | 7/1988 | Schulman | 357/17 |
| 4,769,822 | 9/1988 | Suyama | 357/17 |
| 4,796,268 | 1/1989 | Schairer | 357/17 |

*Primary Examiner*—Martin H. Edlow
*Attorney, Agent, or Firm*—Sughrue, Mion, Zinn, Macpeak & Seas

[57] ABSTRACT

An optical semiconductor device having an active region defined between a pair of semiconductor regions, the active region having an incident end face through which light is introduced and an emission end face through which light is emitted. This device is designed to continuously change the distribution of the density of carriers injected in the active region over the area between the light incident side and the light emission side, thereby changing the density of carriers in the active region from the incident end face to the emission end face.

12 Claims, 4 Drawing Sheets

OPTICAL SEMICONDUCTOR DEVICE

BACKGROUND OF THE INVENTION

This invention relates to an optical semiconductor device for producing laser beam by light amplification due to stimulated emission of a ray which has same phase and same wavelength of incident ray.

In conventional semiconductor light amplifier, each electrode is respectively provided on each major surface of semiconductor regions, and intensity of electric current between these electrodes is uniform over an area through an incident end face and an emission end face on which non-reflective coatings are formed, accordingly current density or carrier density is uniform over an activation region.

In this type of semiconductor light amplifier, because a consuming rate of carrier is not uniform, the carrier becomes surplus at a portion closer to the incident end face, and the carriers become deficient at a portion closer to the emission end face.

If such a semiconductor light amplifier is applied as a semiconductor laser without forming non-reflective coatings on both the incident end and emission end faces, supply of carriers becomes deficient at both the end faces while the carrier becomes surplus in the vicinity of a central portion.

A technique for solving this problem is disclosed in Japanese Patent Publication No. 62-37909 in which one of the electrodes is divided into a plurality of elements, and different intensity of the electric current is applied between the divided elements and the other electrode through the incident end face to the emission end face.

In the above stated publication, a characteristic diagram is shown in FIG. 8 as semi-conductor light amplifier. As can be understood from FIG. 8, it is possible to heighten an optical output limit by controlling electric current densities $J_1$ and $J_2$ in relation to distribution of a photon density $S$.

In the case where one of the electrodes is divided and the carrier density is changed so as to gradually increase the photon density S from the incident side to the emission side, it is necessary to divided the electrode as finely as possible in order to realize characteristics of the device relating to the photon density S whereby the photon density S is continuously increased, as shown in FIG. 8. If the electrode is divided into two or three as in the case of an embodiment disclosed in the above stated publication, the photon density is obliged to become in a stepped fashion as shown in FIG. 9. Even if the electrode is divided more finely, the characteristics of the photon density is obliged to becomes stepped fashion not a little, and the carrier density distribution therefore tends to become disturbed so that a lateral transverse mode or light intensity distribution becomes unstable and that a output mode tends to change into a high-degree mode. In addition, it is extremely difficult, in terms of manufacture, to divide the electrode in a continuous approximation manner, and there is a need to provide a number of power sources corresponding to the number of divided electrodes, consequently an unit thereof becomes in a large size, and control of the unit is difficult.

SUMMARY OF THE INVENTION

In view of the above-described facts, it is an object of the present invention to provide an optical semiconductor device capable of changing density of carrier in an active region continuously from the incident end face to the emission end face in fixed electric current intensity applied to one of the electrodes.

To this end, the present invention provides an optical semiconductor device having each semiconductor region with electrode provided on major surface thereof, and an active region which has an incident end face and an emission end face and is formed between the semiconductor regions, and the optical semiconductor device amplifies light by increasing the photon density with carrier injected in the active region in response to the density of an electric current which flows between the electrodes, wherein the injected carrier density distribution is continuously changed over the area between a light incident side and a light emission side.

Light is amplified in the active region by consuming carrier distributed in the active region in response to the intensity of the electric current flowing through the region between the electrodes. Since the rate at which carriers are consumed varies at different positions in the active region, it is necessary to make the carrier density distribution and the photon density distribution at least similar to each other. In accordance with the present invention, the intensity of the electric current flowing through the region between the two electrodes is continuously changed. That is, the current density in the active region is changed by changing the conductivity or resistivity between the electrodes while the distribution of intensity of the fundamental electric current supplied to one of the electrode is fixed.

It is thereby possible to continuously change the carrier density distribution in conformity with the desired curve from the incident end face to the emission end face This makes it possible to control the carrier density while stabilizing a lateral transverse mode.

DESCRIPTION OF THE PREFERRED EMBODIMENTS

Figure 1:
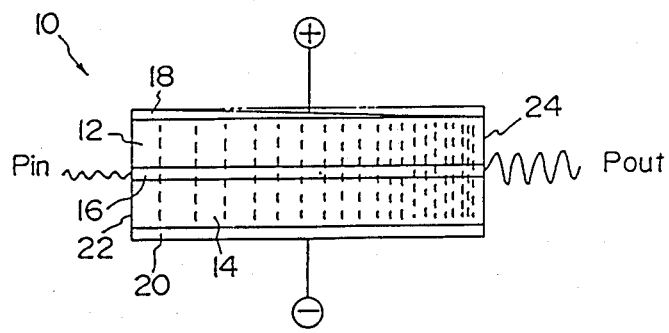
FIG. 1 is a sectional side view of a semiconductor light amplifier which represents a first embodiment of the present invention.
Figure 2:
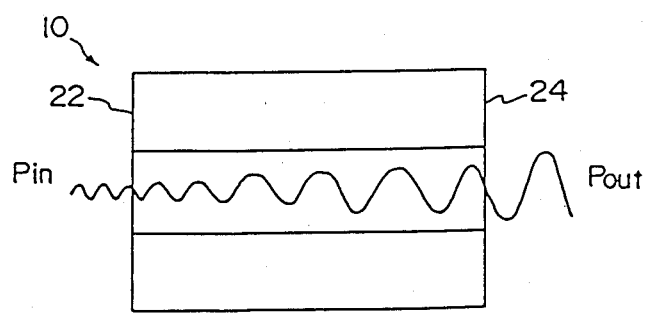
FIG. 2 is a sectional plan view of the semiconductor light amplifier of the first embodiment.

FIGS. 1 and 2 shows a semiconductor light amplifier 10 which represents an embodiment of the present invention and in which a p-type semiconductor region 12 and an-type semiconductor region 14 are located on the upper and lower sides of an active region 16, or the active region 16 is defined between these semiconductor regions. The active region 16 is exhibited as a stripe. An anode electrode 18 and a cathode electrode 20 are attached to major surfaces of the p-type semiconductor region 12 and the n-type semiconductor region 14. As an electric current flows through these electrodes, light introduced from an incident end face 22 (indicated as the left end surface shown in FIG. 1) is gradually amplified while going and returning through the active region 16 between the end surfaces, and is thereafter output through an emission end face 24 as indicated at the right end surface shown in FIG. 1. Non-reflective coatings are formed on the incident end face 22 and the emission end face 24.

The anode electrode 18 of this embodiment is continuously reduced in thickness from the incident end face 22 to the emission end face 24. The double-dashed chain line shown in FIG. 1 indicates a uniform thickness. Thus, the resistance of this electrode is higher in the vicinity of the incident end face 24 than in the vicinity of the emission end face 24, and the change in the resistance is continuous.

Consequently, even if the intensity of the electric current supplied to the anode electrode 18 is uniform, the electric current intensity between the anode and cathode electrodes becomes changed continuously along the path through which the light travels.

The thickness of the anode electrode 18 is determined according to the density of carriers distributed over the active region. That is, in a portion of the active region 16 in the vicinity of or located at the incident end face 22, the photon density is reduced and it is possible to set the carrier density to a lower level, while, in a portion of the active region 16 in the vicinity of or located at the emission end face 24, the photon density is increased and it is necessary to increase the carrier density. In this embodiment, the thickness of the anode electrode is changed to satisfy these conditions, thereby controlling the electric current density over the active region 16 so as to equalize the photon density change rate and the carrier density change rate with each other.

The operation of the thus-constructed first embodiment will be described below.

A predetermined electric current is supplied to the anode electrode 18 of the semiconductor light amplifier 10, and it flows through the region between the anode and cathode electrodes while distributing carriers over the active region 16. If light is introduced from the incident end face 22, carriers are consumed and the photon density is increased, and the light travels forward in one direction and is emitted from the emission end face 24.

Figure 3:
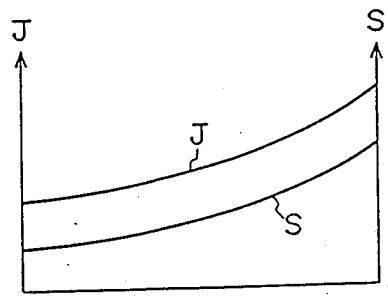
FIG. 3 is a characteristic diagram illustrating the relationship between an electric current density and the photon density when the intensity of an electric current flowing through the region between the anode and cathode electrodes of the first embodiment is changed continuously along the direction in which light travels.

The rate at which the carriers are consumed is low in a portion in the vicinity of or located at the incident end face 22 while it is high in a portion in the vicinity of or located at the incident end face 24. In the first embodiment, the thickness of the anode electrode 18 is increased at the incident end face 22 and a portion closer to this surface, and it is gradually reduced toward the emission end face 24, thereby obtaining the electric current density distribution over the active region 16 such as that shown in FIG. 3 in which the electric current density increases continuously from the incident side to the emission side. The patterns of the carrier density distribution and the photon density distribution over the entire area are thereby made similar to each other, and the efficiency with which carriers are consumed is improved. As a result, the optical output limit becomes higher. In addition, since the carrier density is changed continuously, the lateral transverse mode of light, namely, the light intensity distribution is stabilized, and the fundamental mode (0-degree mode) can be maintained during the operation of outputting light.

It is sufficient to supply the electric current to the anode electrode 18 with a uniform distribution because the resistance between the anode electrode 18 and the cathode electrode 20 is previously changed along the direction in which light travels, thus eliminating the need to controlling the electric current intensity distribution over the electrodes by dividing one of the electrodes as in the case of the conventional technique. The control of the device is thereby facilitated, the device can be operated with a single power source, and the overall size of the unit for operating the device can be reduced.

A second embodiment of the present invention will be described below. With respect to a semiconductor light amplifier 30 which represents the second embodiment, portions identical to those shown in FIG. 1 are indicated by the same reference characters, and the description of the constructions thereof will not be repeated.

Figure 4:
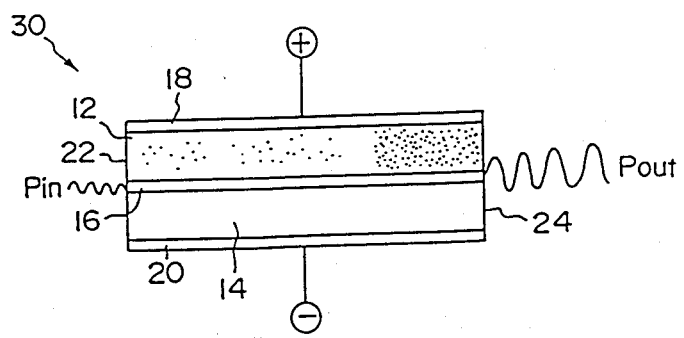
FIG. 4 is a sectional side view of a semiconductor light amplifier which represents a second embodiment of the present invention.

In this embodiment, as shown in FIG. 4, electrodes 18 and 20 of an ordinary type in the form of plates having a uniform thickness are used. The distribution of intensity of the electric current flowing through the region between the electrodes is controlled in such a manner that the resistivity of the p-type semiconductor region 12 is changed by adding an impurity as indicated by dots in FIG. 4 to the p-type semiconductor region. The impurity density is higher in a portion in the vicinity of or located at the emission end face 24 than in a portion in the vicinity of or located at the incident end face, and it is changed continuously. The impurity density may be zero in a portion of the active region 16 in the vicinity of the incident end face.

An acceptor which contributes to formation of a positive hole in a p-GaAs substrate is applied if it is added as in impurity to the p-type semiconductor 22 as in the case of the second embodiment. The semiconductor region to which an impurity is added may be of the n-type. In this case, a donor is applied as an impurity. Addition of such an impurity or doping may be performed during a crystal growth process and may be performed by diffusing the impurity from the crystal surface or by ion injection.

The resistivity of the p-type semiconductor region 12 is reduced and the electric current is increased as the impurity content is heightened, thus enabling the same effects as the first embodiment.

Figure 5:
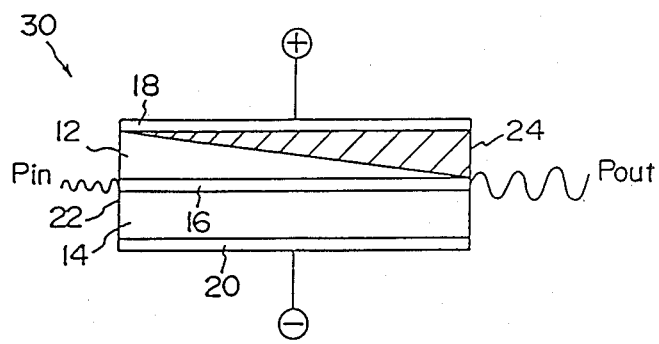
FIG. 5 is a sectional side view of an example of modification of the second embodiment.

In the second embodiment, an impurity is added so as to change the resistivity of the p-type semiconductor region 12. Instead, Zn or the like may be diffused in a p-GaAs substrate, as represented by the hatched portion in FIG. 5. To effect this, the diffusion time is varied by masking or the like to control the extent of diffusion so as to change the resistivity. Otherwise, the arrangement may be such that a p-GaAs substrate in which Zn is diffused and another p-GaAs to which no impurity is added are manufactured separately and are thereafter connected to each other.

Next, a third embodiment of the present invention will be described below.

Figure 6:
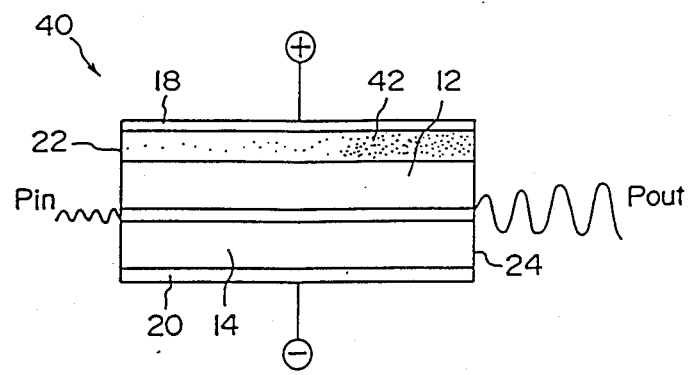
FIG. 6 is a sectional side view of a semiconductor light amplifier which represents a third embodiment of the present invention.

As shown in FIG. 6, a semiconductor light amplifier 40 which represents the third embodiment is constructed by adding a resistance-variable region 42 to the ordinary arrangement without modifying the regions 12 and 14 and the electrodes 18 and 20. The region 42 is formed between the p-type semiconductor region 12 and the anode electrode 18, thereby controlling the distribution of intensity of the electric current flowing through the region between the electrodes. The material of the resistance-variable region may be the same as that of the p-type semiconductor while an impurity is added to the material. Instead, the arrangement may be such that the resistance material region is formed of the same material as that of the anode electrode and that it is combined with the ordinary anode electrode so as to continuously change the entire thickness. Any type of electric material is applicable so long as it enables the intensity of the electric current flowing through the region between the electrodes to be changed.

In accordance with the third embodiment, only the resistance-variable region is prepared separately from the other components, thereby facilitating the manufacture of the semiconductor and handling of the components.

In the first to third embodiments, the semiconductor light amplifiers 10, 30, and 40 exemplify the design to improve the carrier consumption efficiency by determining the carrier density in accordance with the photon density. It is also possible to obtain the same effects with respect to semiconductor lasers which are constructed without forming non-reflective coatings on the incident end face and emission end face of the semiconductor light amplifiers 10, 30, and 40. In these semiconductor lasers, light is reflected on the opposite end surfaces so that it goes and returns inside the active region 16. While traveling in this manner, the light is amplified by the effect of induced emission. When the quantity of amplified light becomes equal to the quantity of light lost by internal absorption and transmission through the opposite reflective surfaces, oscillation takes place, and the light is emitted through the emission end face 24. Since, in the semiconductor laser, light goes and returns inside the active region, the photon density distribution differs from that in the case of application to the semiconductor light amplifier.

Figure 7:
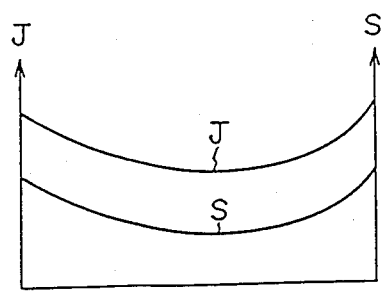
FIG. 7 is a characteristic diagram illustrating the relationship between the electric current density and the photon density when the semiconductor light amplifier is applied as a semiconductor laser.
Figure 8:
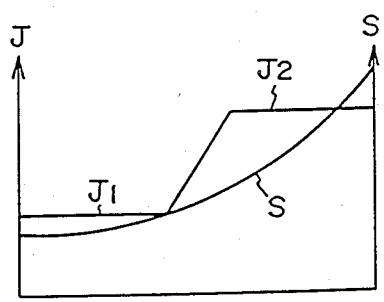
FIG. 8 is a characteristic diagram illustrating the relationship between the electric current density and the photon density when the intensity of electric current is controlled by dividing the electrode.
Figure 9:
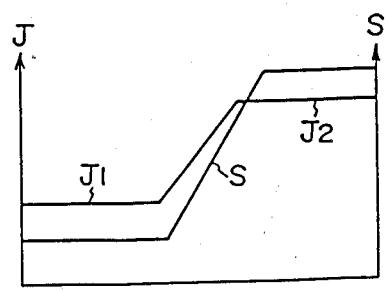
FIG. 9 is a characteristic diagram illustrating the relationship between the electric current density and the photon density when the number of divided electrodes is small.

In the case of application to the semiconductor laser, the pattern of the photon density distribution S is as indicated in FIG. 7, and it is necessary to change the thickness of the electrode or adding an impurity to the semiconductor region so as to make the carrier density higher at a central portion higher than at opposite end surfaces. In this case also, the electric current density J is changed continuously (see FIG. 7), and the transverse mode does not become unstable.

As described above, the optical semiconductor device in accordance with the present invention is highly advantageous in that the density of carriers in the active region can be continuously varied form the incident end face to the emission end face.

What is claimed is:

1. An optical semiconductor device comprising a pair of semiconductor regions with electrodes provided on major surfaces of said semiconductor regions, and an active region having incident end and emission end faces and formed between said semiconductor regions, said optical semiconductor device amplifying light by increasing the photon density with carriers injected in said active region in response to the density of an electric current flowing through the region between said electrodes, wherein the injected carrier density distribution is continuously changed over the area between the light incident side and the light emission side.

2. An optical semiconductor device according to claim 1, wherein said change in the injection carrier density distribution is effected by changing the thickness of at least one of said electrodes continuously and gradually from said incident end face to said emission end face surface.

3. An optical semiconductor device according to claim 1, wherein said change in the injected carrier density distribution is effected by adding an impurity to at least one of said semiconductor regions while changing the density of said impurity continuously from said incidence-end surface to said emergence-end surface.

4. An optical semiconductor device according to claim 1, wherein said change in the injected carrier density distribution is effected by interposing a resistance-variable region between one of said electrodes and one of said semiconductor regions adjacent thereto, the resistance of said resistance-variable region being changed continuously from said incident end face to said emission end face.

5. An optical semiconductor device having a p-type semiconductor region with an anode electrode formed over a major surface of said p-type semiconductor region, an n-type semiconductor region with an cathode electrode formed over a major surface of said n-type semiconductor region, and an active region formed between said p-type and n-type semiconductor regions, said active region having incident end and emission end face, said optical semiconductor device amplifying light by increasing the photon density with carriers injected in said active region in response to the density of an electric current flowing through the region between said electrodes, wherein the injected carrier density distribution is continuously increased over the area between the light incident side and the light emission side.

6. An optical semiconductor device according to claim 5, wherein said continuous increase in the injected carrier density distribution is effected by reducing the thickness of said anode electrode continuously and gradually from said incident end face to said emission end face.

7. An optical semiconductor device according to claim 5, wherein said continuous increase in the injected carrier density distribution is effected by adding an impurity to said p-type semiconductor region while increasing the density of said impurity continuously from said incident end face to said emission end face.

8. An optical semiconductor device according to claim 5, wherein said continuous increase in the injected carrier density distribution is effected by interposing a resistance-variable region between said p-type semiconductor and said anode electrode, the resistance of said resistance-variable region decreasing continuously from said incident end face to said emission end surface.

9. An optical semiconductor device for amplifying introduced light and emitting light thereby amplified, comprising:
- a pair of semiconductor regions with electrodes provided on major surfaces of said semiconductor regions;
- an active region formed between said semiconductor regions, said active region having an incident end face through which light is introduced and an emission end face through which light is emitted; and
- changing means for changing the distribution of the density of carriers continuously over the area between the incident end face and the emission end face, the carriers being injected in said active region in response to the density of an electric current flowing through the region between said electrodes.

10. An optical semiconductor device according to claim 9, wherein said changing means is formed by changing the thickness of at least one of said electrodes continuously and gradually from said incident end face to said emission end face.

11. An optical semiconductor device according to claim 9, wherein said changing means is formed by adding an impurity to at least one of said semiconductor regions while changing the density of said impurity continuously from said incident end face to said emission end face.

12. An optical semiconductor device according to claim 9, wherein said changing means is formed by interposing a resistance-variable region between one of said electrodes and one of said semiconductor regions adjacent thereto, the resistance of said resistance-variable region being changed continuously from said incident end face to said emission end face.

* * * * *